United States Patent
Amini et al.

(10) Patent No.: US 6,234,807 B1
(45) Date of Patent: May 22, 2001

(54) CIRCUIT BOARD CONNECTOR EDGE WITH STRADDLE PATTERN TAB DESIGN FOR IMPEDANCE-CONTROLLED CONNECTIONS

(75) Inventors: Kamran Amini, Cary; Joseph Curtis Diepenbrock, Raleigh; Robert J. Evans, Cary; Mike L. Scollard; Marcel B. Tran, both of Raleigh, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/489,807

(22) Filed: Jan. 24, 2000

(51) Int. Cl.[7] ..................................................... H01R 9/09
(52) U.S. Cl. .............................................. 439/60; 439/59
(58) Field of Search .................................. 439/59, 60, 951

(56) References Cited

U.S. PATENT DOCUMENTS

| | | |
|---|---|---|
| 3,399,372 * | 8/1968 | Uberbacher . |
| 5,259,768 | 11/1993 | Brunker et al. . |
| 5,277,591 | 1/1994 | Feleman et al. . |
| 5,403,208 | 4/1995 | Feleman et al. . |
| 5,522,737 | 6/1996 | Brunker et al. . |
| 5,730,609 | 3/1998 | Harwath . |
| 5,772,448 * | 6/1998 | Ekrot et al. ............................ 439/60 |
| 5,853,303 | 12/1998 | Brunker et al. . |
| 5,865,631 * | 2/1999 | Berto et al. ............................ 439/59 |
| 5,919,049 * | 7/1999 | Petersen et al. ....................... 439/60 |
| 5,944,541 | 8/1999 | Payne . |

* cited by examiner

Primary Examiner—Lincoln Donovan
Assistant Examiner—Thanh-Tam Le
(74) Attorney, Agent, or Firm—George E. Grosser; Andrew Dillon

(57) ABSTRACT

A printed circuit board connector edge tab design has increased tab contact area with a large local capacitance at the connector interface. This serves to balance out the inductive effects of the connector and results in a lower overall channel impedance at the interface. The invention replaces the prior art plated pathway to the upper row of tabs with wider tabs on the lower row. The edges of the lower row tabs are spaced such that each of the connector pins destined for the upper row straddle two of the lower tabs as they travel upward. This design prevents the pins from contacting the fiberglass substrate of the board while it traverses the lower row of tabs. The absence of the prior art plated pathways allows each of the lower row tabs to be expanded into the space formerly occupied by the pathways. This design also allows the increased capacitive area of the edge tabs to be located in very close proximity to the connection area between the connector pins and the edge tabs.

8 Claims, 1 Drawing Sheet

CIRCUIT BOARD CONNECTOR EDGE WITH STRADDLE PATTERN TAB DESIGN FOR IMPEDANCE-CONTROLLED CONNECTIONS

BACKGROUND OF THE INVENTION

1. Technical Field

This invention relates in general to improved interfaces between pin connectors and printed circuit boards, and in particular to improved printed circuit boards. Still more particularly, the invention relates to an improved tab design for printed circuit board connector edges.

2. Description of the Prior Art

As the designs of computer processors and other supporting hardware become increasing complex, so too are the physical designs of the printed circuit boards, such as mother boards and daughter boards, that they utilize. For example, in circuit boards that contain advanced, high-speed, impedance-controlled channels, it is difficult to match impedances at the connector interfaces. Generally, impedance has two aspects: resistance and reactance. Resistance impedes current by converting electrical energy to heat and is always greater than zero. Reactance impedes current, but varies with frequency and can be positive or negative. The electrical characteristics of the connectors and the associated via patterns on circuit boards tend to present highly inductive influences on the signal lines. These inductive influences create discontinuities in the line impedance which, in turn, cause reflection noise on the signal lines, thereby degrading the overall quality of the signals.

Although the size of the edge tabs on daughter cards can be increased to compensate for the effects of the impedance discontinuities, there are several mechanical factors which limit the extent to which the size of the edge tabs may be increased. As shown in FIG. 1, the first limitation is the mechanical requirement that "vertical" (top to bottom) plated pathways 11 be provided for the mother board connector pins (not shown) which mate to the "upper" row 13 of contacts 15. The plated pathways 11 allow the connector pins to slide from the beveled perimeter edge 17 of the daughter card 19 up to the contact areas on the upper edge tabs (indicated schematically at 21) without grinding on the bare fiberglass substrate 23 of the daughter card 19. Such grinding would lead to premature wear of the connector pins which, in turn, would cause intermittent electrical contacts and short circuits between the signal wires passing through the connector.

The "lower" row 25 of contacts 27 are touched by the connector pins at areas 29. The lower row contacts 27 are typically used for signal line connections and have a size limitation in the "horizontal" direction (left to right in FIG. 1). The lower edge contacts 27 require a safety buffer 31 of about 5 mils from the plated pathways 11 between each signal contact 27. Violating this minimum distance for buffer gaps can cause short circuits between the pathways, thereby shorting the upper row of reference contacts 15.

The second limiting factor is the electrical effect of the capacitive pad area on the actual connector pin contact area. Increasing the signal pad area upward, or in the vertical direction, has diminishing returns. The farther away the capacitive area is from the pin contact area, the less effect it will offer in compensating for the impedance mismatch at the connector interface. Thus, an improved printed circuit board card edge design which overcomes the limitations of the prior art is needed. It would be desirable to provide an improved printed circuit board card edge design which has sufficient contact area without resulting in inductive effects.

SUMMARY OF THE INVENTION

A printed circuit board connector edge tab design allows for increased contact area while bypassing previously restrictive mechanical limitations. The enlarged edge tabs create a larger local capacitance at the connector interface. This serves to balance out the inductive effects of the connector and results in a lower overall channel impedance at the interface. The invention replaces the prior art plated pathway to the upper row of tabs with wider tabs on the lower row. The edges of the lower row tabs are spaced such that each of the connector pins destined for the upper row straddle two of the lower tabs as they travel upward. This design prevents the pins from contacting the fiberglass substrate of the board while it traverses the lower row of tabs. The absence of the prior art plated pathways allows each of the lower row tabs to be expanded into the space formerly occupied by the pathways. This design also allows the increased capacitive area of the edge tabs to be located in very close proximity to the connection area between the connector pins and the edge tabs.

Accordingly, it is an object of the present invention to provide improved interfaces between pin connectors and printed circuit boards.

It is an additional object of the present invention to provide improved printed circuit boards.

Still another object of the present invention is to provide an improved tab design for printed circuit board connector edges.

The foregoing and other objects and advantages of the present invention will be apparent to those skilled in the art, in view of the following detailed description of the preferred embodiment of the present invention, taken in conjunction with the appended claims and the accompanying drawings.

BRIEF DESCRIPTION OF THE DRAWINGS

So that the manner in which the features, advantages and objects of the invention, as well as others which will become apparent, are attained and can be understood in more detail, more particular description of the invention briefly summarized above may be had by reference to the embodiment thereof which is illustrated in the appended drawings, which drawings form a part of this specification. It is to be noted, however, that the drawings illustrate only a preferred embodiment of the invention and is therefore not to be considered limiting of its scope as the invention may admit to other equally effective embodiments.

DETAILED DESCRIPTION OF THE PREFERRED EMBODIMENT

Typical high-volume, low-cost printed circuit board (PCB) connectors exhibit a higher signal line impedance than is desired for high performance signal lines, such as 28 ohm, high-speed, impedance-controlled channels. These higher-impedance connectors produce the indicative impedance "humps" in time domain reflectometry (TDR) measurements. TDR measurements provide designers with the impedance compensation values required to bring impedance discontinuities on signal lines back into acceptable ranges.

The electrical impedance of a signal line is dependent on both the inductance and the capacitance of the various parts of the connectors and PCB wires. The inductance encountered in a card edge tab connector comes almost entirely from the connector's internal wires and mounting holes. This inductance value is not easily adjustable, and known values are readily available from manufacturers for the electrical modeling of the connector. The capacitances encountered in the connector are mainly from the connector mounting hole by way of ring patterns on the mother board and edge tabs on the daughter card. The connector capacitances can be more easily modified to compensate for the impedance discontinuities. By redesigning the reference and signal tabs, the capacitance of the card edge tabs is increased, which therefore lowers the characteristic impedance to match the specified range.

Figure 1:
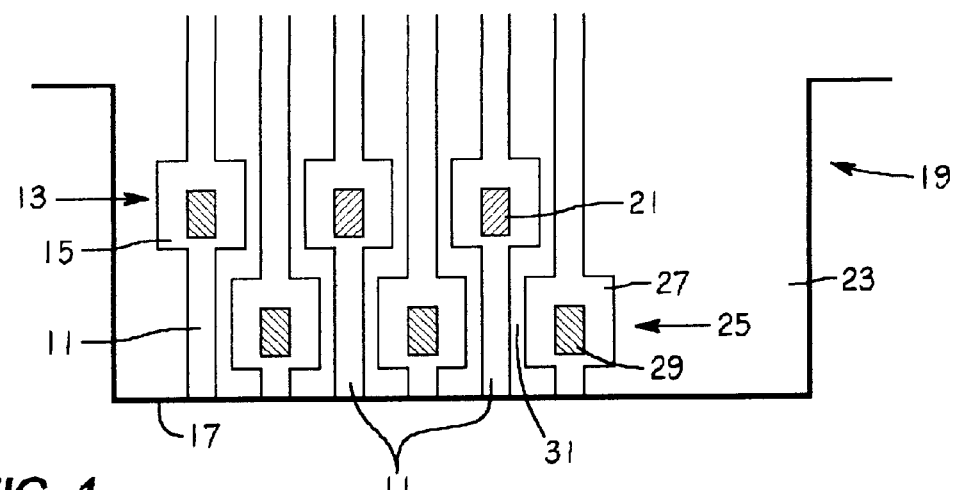
FIG. 1 is an enlarged, schematic plan view of a prior art circuit board connector edge.

As stated in the background section of this document, the enlargement of these pads is limited by the space occupied by the plated pathways which extend vertically from each of the upper card edge tabs down to the edge of the daughter card (see FIG. 1). The plated pathways provide a mechanism by which the pins in the connector for the upper row of tabs ride over during insertion of the daughter card into the connector, thereby preventing them from grinding on the bare fiberglass substrate of the circuit board.

Figure 2:
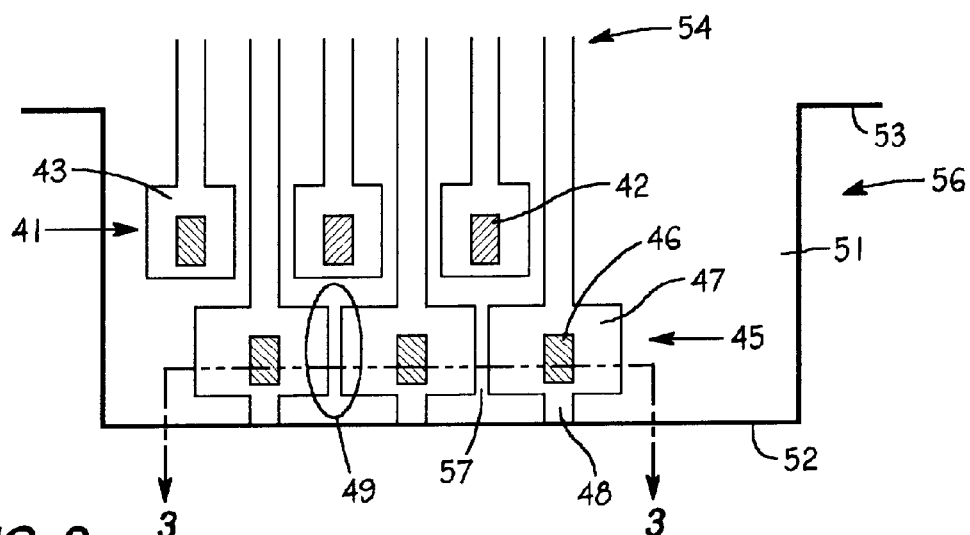
FIG. 2 is an enlarged, schematic plan view of a circuit board connector edge constructed in accordance with one embodiment of the invention.
Figure 3:
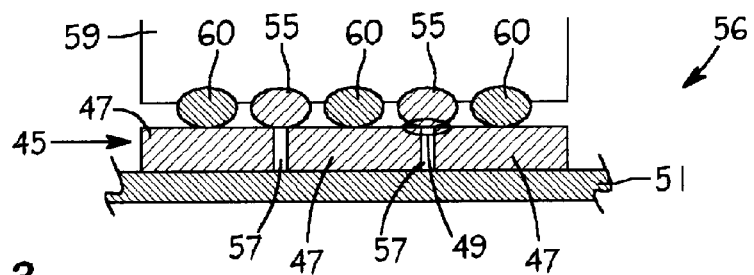
FIG. 3 is a schematic sectional side view of the circuit board connector edge of FIG. 2 taken along the line 3—3 of FIG. 2 and illustrating contact with connector pins.

Referring now to FIGS. 2 and 3, a printed circuit board 52 having a plurality of electrical circuits 54 and an edge tab connector 56 is shown. Edge tab connector 56 has two independent series or rows 41, 45 of electrically conductive edge tabs 43, 47, respectively. Each edge tab 43, 47 has a surface area 42, 46, respectively (indicated schematically in FIG. 2), that contacts the pins of a mating connector 59. Tabs 47 are located adjacent to perimeter 52 of edge tab connector 56, and have perimeter portions 48 that directly intersect perimeter 52. Tabs 41 are spaced apart from perimeter 52 and are free of intersection with perimeter 52. As shown in FIG. 2, tabs 47 have significantly greater widths than tabs 43.

The design improvement of the present invention replaces the prior art plated pathways of the upper row 41 of reference edge tabs 43 and the area they formerly occupied with larger edge tab areas on the bottom or signal row 45 of tabs 47. The lower edge tabs 47 are spaced appropriately to provide an elevated guide pathway 49 (indicated schematically) for an upper row connector pins 55 in the mating connector 59. The upper row connector pins 55 cross over the lower edge tabs 47 on their way to the contact areas 42 in upper row 41 of upper edge tabs 43. At no time do the upper row connector pins 55 contact the insulative fiberglass substrate 51 of the printed circuit board 53. Instead, as shown in FIG. 3, each of the upper row connector pins 55 slidingly straddle the gap 57 between two adjacent ones of the lower edge tabs 47 during insertion and/or removal of board 53 relative to the connector 59. In this way, adjacent ones of the tabs 47 simultaneously support respective ones of the pins 55 during insertion and removal procedures. Note that the leftmost tab 47 (FIG. 2) is capable of supporting the leftmost pin 55 to prevent it from contacting substrate 51. Alternatively, an extra, non-functional pad 47 may be provided so that the leftmost pin 55 straddles two pads 47. The lower row connector pins 60 contact areas 46 after wiping against perimeter portions 48 and tabs 47.

The lower edge tabs 47 are spaced close enough to each other to properly support the connector pins 55. If lower edge tabs 47 were spaced further apart, the pins 55 could fall between the edges of the tabs 47, grind on the bare fiberglass substrate 51, and grind on the sharp corners of the plated lower edge tabs 47. Note that the vertical length 49 (FIG. 2) of the lower edge tabs 47 is short enough so that electrical crosstalk is not a significant factor in the tab spacings.

The invention has several advantages including a new compensation pattern for printed circuit board edge tab designs that bypasses the mechanical constraints of prior art card edge tab designs. This design provides the connector compensation areas in close proximity to the pinto-tab connection area, thereby greatly increasing its influence over the signal line impedance discontinuities. In addition, the invention maintains tightly controlled signal line impedance characteristics through the connectors.

While the invention has been shown or described in only some of its forms, it should be apparent to those skilled in the art that it is not so limited, but is susceptible to various changes without departing from the scope of the invention.

What is claimed is:

1. A printed circuit board, comprising:
   an insulative substrate having a plurality of electrical circuits;
   an edge tab connector extending from the substrate and having a perimeter, the edge tab connector adapted to be slidingly inserted into and removed from an electrical connector having a first set of pins and a second set of pins;
   a first series of electrically conductive edge tabs on the edge tab connector adjacent to the perimeter of the edge tab connector, the first series of edge tabs being interconnected with at least some of the circuits and having portions that intersect the perimeter, wherein the first series of edge tabs is adapted to be interconnected with the first set of pins of the electrical connector;
   a second series of electrically conductive edge tabs on the edge tab connector spaced apart from the perimeter of the edge tab connector, the second series of edge tabs being interconnected with at least some of the circuits and being free of intersection with the perimeter, wherein the second series of edge tabs is adapted to be interconnected with the second set of pins of the electrical connector; and wherein
   the edge tabs in the first series are adapted to engage the first set of pins of the electrical connector, and wherein the edge tabs in the first series form guide pathways that are adapted to engage the second set of pins of the electrical connector.

2. The printed circuit board of claim 1 wherein individual ones of the edge tabs in the first series are adapted to support respective ones of the first set of pins of the electrical connector; and wherein adjacent ones of the edge tabs in the first series are adapted to simultaneously support respective ones of the second set of pins of the electrical connector.

3. The printed circuit board of claim 1 wherein the edge tabs of the first series have greater widths than those of the second series.

4. An electrical assembly, comprising in combination:
   an electrical connector having a first set of pins and a second set of pins;
   a printed circuit board having a substrate with a plurality of electrical circuits, and an edge tab connector extending therefrom with a perimeter for engaging the electrical connector;
   a first series of electrically conductive tabs on the edge tab connector adjacent to the perimeter of the edge tab connector, the tabs being interconnected with at least some of the circuits and having portions that intersect the perimeter for interconnecting with the first set of pins of the electrical connector;

a second series of electrically conductive tabs on the edge tab connector spaced apart from the perimeter of the edge tab connector, the tabs being interconnected with at least some of the circuits and being free of intersection with the perimeter for interconnecting with the second set of pins of the electrical connector; and wherein the edge tabs in the first series are adapted to engage the first set of pins of the electrical connector, and wherein the tabs in the first series form guide pathways that engage the second set of pins of the electrical connector, such that individual ones of the edge tabs in the first series are adapted to support singular ones of the first set of pins of the electrical connector, and wherein adjacent ones of the tabs in the first series simultaneously support respective ones of the second set of pins of the electrical connector during insertion and removal of the edge tab connector relative to the electrical connector.

5. The electrical assembly of claim 4 wherein the tabs of the first series have greater widths than those of the second series.

6. A method for interconnecting an electrical connector to a printed circuit board, the electrical connector having a first and second set of pins, comprising the steps of:

(a) providing a substrate with an edge tab connector having a perimeter, a first series of tabs adjacent to the perimeter, and a second series of tabs spaced apart from the perimeter;

(b) inserting the edge tab connector into the electrical connector;

(c) sliding the second set of pins of the electrical connector over the first series of tabs such that the first series of tabs forms guide pathways for the second set of pins, and the second set of pins are free of contact with the substrate at all times;

(d) positioning the second set of pins of the electrical connector on the second series of tabs to complete electrical interconnections; and (e) sliding the first set of pins of the electrical connector onto the first series of tabs to complete electrical interconnections.

7. The method of claim 6 wherein step (c) comprises simultaneously supporting respective ones of the second set of pins of the electrical connector with adjacent ones of the tabs in the first series.

8. The method of claim 6, further comprising the step of disconnecting the electrical connector from the edge tab connector by sliding the second set of pins back over the first series of tabs to prevent contact between the second set of pins and the substrate.

* * * * *